United States Patent [19]
Rohrer et al.

[11] Patent Number: 5,214,300
[45] Date of Patent: May 25, 1993

[54] MONOLITHIC SEMICONDUCTOR INTEGRATED CIRCUIT FERROELECTRIC MEMORY DEVICE

[75] Inventors: George A. Rohrer, Benton Harbor, Mich.; Larry McMillan, Longmont, Colo.

[73] Assignee: Ramtron Corporation, Colorado Springs, Colo.

[21] Appl. No.: 763,371

[22] Filed: Nov. 27, 1991

Related U.S. Application Data

[60] Continuation of Ser. No. 611,058, Nov. 9, 1990, abandoned, which is a division of Ser. No. 793,186, Oct. 31, 1985, Pat. No. 5,024,964, which is a division of Ser. No. 133,338, Mar. 24, 1980, Pat. No. 4,707,897, which is a continuation-in-part of Ser. No. 658,199, Feb. 17, 1976, Pat. No. 4,195,355, which is a continuation-in-part of Ser. No. 316,417, Dec. 18, 1972, Pat. No. 3,939,292, which is a continuation-in-part of Ser. No. 76,059, Sep. 28, 1970, Pat. No. 3,728,694.

[51] Int. Cl.$^5$ .............. H01L 27/02; H01G 4/38; G11C 11/22
[52] U.S. Cl. ............ 257/295; 365/145; 361/330
[58] Field of Search .......... 257/295; 365/145; 361/330

[56] References Cited

U.S. PATENT DOCUMENTS

| | | | |
|---|---|---|---|
| 3,728,694 | 4/1973 | Rohrer | 361/321 |
| 3,939,292 | 2/1976 | Rohrer | 427/100 |
| 4,068,217 | 1/1978 | Arnett et al. | 357/41 |
| 4,149,301 | 4/1979 | Cook | 357/71 |
| 4,149,302 | 4/1979 | Cook | 357/51 |
| 4,195,355 | 3/1980 | Rohrer | 427/100 |
| 4,707,897 | 11/1987 | Rohrer et al. | 29/25.42 |
| 4,713,157 | 12/1987 | McMillan et al. | 204/192.25 |

Primary Examiner—Rolf Hille
Assistant Examiner—Robert Limanek
Attorney, Agent, or Firm—Edward D. Manzo; Mark J. Murphy; Irving Weiner

[57] ABSTRACT

A monolithic semiconductor integrated circuit-ferroelectric device is disclosed together with the method of manufacturing same. The ferroelectric device preferably consists of a layer of stable ferroelectric potassium nitrate disposed between electrical contacts positioned on opposite surfaces of the ferroelectric layer. The ferroelectric layer has a thickness of less than 110 microns, and preferably falling within a range of from 100 Angstrom units to 25,000 Angstrom units. The process of manufacturing the monolithic structure is multi-stepped and is particularly adapted for fabricating a potassium nitrate ferroelectric memory on a semiconductor integrated circuit.

8 Claims, 8 Drawing Sheets

MONOLITHIC SEMICONDUCTOR INTEGRATED CIRCUIT FERROELECTRIC MEMORY DEVICE

BACKGROUND OF THE INVENTION

This application is a continuation of application Ser. No. 07/611,058 filed Nov. 9, 1990 (now abandoned), which is a division of application Ser. No. 793,186 filed Oct. 31, 1985 now U.S. Pat. No. 5,024,964 issued Jun. 18, 1991, which is a divisional of application Ser. No. 133,338 filed Mar. 24, 1980 now U.S. Pat. No. 4,707,897 issued Nov. 24, 1987, which is a continuation-in-part of application Ser. No. 658,199 filed Feb. 17, 1976 now U.S. Pat. No. 4,195,355, which is a continuation-in-part of application Ser. No. 316,417 filed Dec. 18, 1972 now U.S. Pat. No. 3,939,292, which is a continuation-in-part of Ser. No. 76,059 filed Sep. 28, 1970 now U.S. Pat. No. 3,728,694.

There have been recent breakthroughs in preparing ferroelectric devices comprising ferroelectric potassium nitrate. These devices are particularly useful as computer memory cells and preferably employ Phase III potassium nitrate in the ferroelectric phase which, in thin film form, is stable at ordinary room temperature and pressure. U.S. Pat. Nos. 3,728,694 and 3,939,292 disclose the preparation of such memory devices in detail and their teachings are incorporated herein by reference.

Various ferroelectric materials have been studied for their information storage capability. Although many materials exhibit the ferroelectric phenomenon, the predominant materials previously studied for memory application are barium titanate, potassium dihydroxide phosphate, tri-glycerine sulfate, and Phase III potassium nitrate. Phase III potassium nitrate exhibits a well defined critical switching threshold. Three conditions which must be fulfilled for a crystalline material to exhibit ferroectricity are as follows:

1. It must have a phase transition from a polar to a non-polar structure, or at least must tend, with rising temperature, toward such a transition.

2. The polar phase must have a spontaneous polarization, that is, the unit cell must actually have a dipole moment, not only belong to a space group which is capable of such a moment.

3. The direction of the spontaneous polarization must be reversible by the applied electric field. This third condition is the most important.

The ferroelectric portion of this application and the parent application is in the form of a capacitor memory cell. Geometrically, the memory cell is a capacitor with upper and lower metal electrodes sandwiching the ferroelectric material as the dielectric. As taught in U.S. Pat. Nos. 3,728,694, the ferroelectric material should be less than 110 microns and preferably have a thickness within the range of from 100 Angstrom units to 1,000 Angstrom units. When the ferroelectric material is Phase III potassium nitrate, a thickness of less than 1 micron is preferred in order to achieve fast switching times. Fabricating multilayered devices such as these including metal layers are usually accomplished utilizing high vacuum deposition techniques.

The fabrication of semiconductor integrated circuits are well known and conventional. As used herein, the term "semiconductor integrated circuit" is intended to include, inter alia, MOS and bipolar designs. These devices have also, in the past, been used in conjunction with various memory devices. Never before, however, have semiconductor integrated circuits been fabricated with thin film ferroelectric memory devices in a monolithic structure. Furthermore, semiconductor integrated circuits have never been placed within a monolithic structure including a thin film ferroelectric memory device, preferably including Phase III potassium nitrate as the dielectric.

The monolithic semiconductor integrated circuit and ferroelectric memory device of the present application is capable of at least $10^{10}$ read/write cycles of operation without failure. If, however, a more long-lasting memory device is sought, certain modifications are necessary which form another aspect of the present invention. More specifically, it was found that beyond $10^{10}$ read/write cycles, the metal electrodes which sandwich the potassium nitrate layer eventually oxidize in response to a chemical reaction between the $KNO_3$ and the electrodes. This oxidation reaction is accelerated in the presence of an electric field and current flow through the ferroelectric layer.

It was also found that occasional failures occur due primarily to cracks in the $KNO_3$ layer. The electrode materials have a tendency to migrate into these cracks or imperfections and short out the device when electrode materials on one side of the ferroelectric layer contact electrode materials on the opposite side of the ferroelectric layer.

The use of semiconductor integrated circuits fabricated with thin film ferroelectric memory devices in a monolithic structure requires the use of the unique processing steps which forms one aspect of the present invention. It was found that the ferroelectric memory layer, particularly Phase III potassium nitrate, is particularly sensitive to liquids such as water. This fact has lead to the need for development of a unique method of fabricating the semiconductor integrated circuit-ferroelectric layer in order to produce a structure which is of practical utility.

SUMMARY OF THE INVENTION

It is an object of the present invention to produce a monolithic semiconductor integrated circuit and ferroelectric memory device without the drawbacks as discussed above.

It is a further object of the present invention to produce a monolithic semiconductor integrated circuit which is capable of performing at least and/or in excess of $10^{10}$ read/write cycles without failure.

It is yet another object of the present invention to produce a monolithic semiconductor integrated circuit which substantially eliminated the failure rate due to the shorting out of electrodes through imperfections in the $KNO_3$ layer.

Further objects and improvements of the present invention will become apparent when reading the present disclosure.

It has been found that if a semiconductor integrated circuit and ferroelectric device can be placed within a monolithic structure, several distinct and important advantages can be realized. Firstly, the space that the two devices occupy is considerably reduced. This can be very important when one considers the micro processing applications that such devices are intended to satisfy. Secondly, it has been found that the speed of the monolithic structure is improved as compared to an individual semiconductor integrated circuit and a separate memory device in conventional form. This is primarily due to the relatively great distances which separate these individual devices in the prior art as compared to the size of the devices themselves and particularly the proximity which these devices occupy in a monolithic structure. Thirdly, the reliability problems are greatly reduced for whenever contacts and leads can be eliminated, the overall reliability of the system improves. Fourthly, a number of ferroelectric memory devices can be stacked in a single monolithic structure allowing for an expanded memory unit occupying extremely small space. Fifth, and lastly, the cost of producing a monolithic structure is less than the fabrication costs of producing an individual semiconductor integrated circuit and separate ferroelectric chip for later connection.

The monolithic device as described in this application can be fabricated by stacking one or more ferroelectric memories on top of the semiconductor integrated circuit or the ferroelectric device can be placed on a chip surrounded by the semiconductor integrated circuit. Fabrication of both methods are quite similar and will be discussed together. The surface interconnects of the semiconductor integrated circuit can be used as the bottom electrode if the memory array occupies an area separate but on the same level as the integrated circuit. If the memory array is to be fabricated on top of the integrated circuit, the bottom electrode would be separate and insulated from the interconnects. In other words, if the monolithic device is to have the form of a ferroelectric memory unit surrounded by a semiconductor integrated circuit, then the interconnects can function as the bottom electrode. In the form of a "stacked" monolithic structure, the bottom electrode of the ferroelectric member must be separate and distinct from the conductive interconnects of the integrated circuit.

Once the interconnects are formed, a non-semiconductor dielectric layer is placed thereon through which interconnect and bonding pads are formed. The interconnect pads will be used to functionally connect the electrodes of the ferroelectric device to predetermined points on the surface of the integrated circuit. The bonding pads will later be used to connect other areas of the integrated circuit to external sources the nature of which depend upon the ultimate use of the present device. The non-semiconductor dielectric can be such things as CVD (chemical vapor deposition) glass or silicon nitride. The low temperature glass can be deposited by low temperature passivation techniques at temperatures which are normally below 400° to 900° C. Other techniques used to grow a layer of silicon dioxide or silicon nitride are by vapor deposition, expitaxial techniques to form epitaxial reaction glasses, anodic oxidation and high vacuum deposition of insulating materials such as sputtered quartz. Some of these techniques are described in detail in U.S. Pat. No. 3,886,582.

Again, by use of standard photoresist techniques, the bottom electrode can be formed. The interconnects can be the bottom electrode in a non-stacking type of device. The bottom electrode can be metal such as aluminum, silver or gold or other conducting materials such as doped polysilicon or doped single crystal silicon. However, certain ordinary metals can cause the device to cease to operate after about $10^{10}$ read/write cycles due to oxidization of the electrode materials (notably aluminum). The interconnects or electrodes of the present invention can be fabricated from a conductive metal oxide such as indium-tin oxide ($In_2O_3SnO_2$), tin oxide ($SnO_2$) and palladium oxide (PdO), or any other conductive oxide which may be deposited by any well known technique, such as by RF sputtering or reactive sputtering. If reactive sputtering is employed, a metal such as indium-tin alloy can be employed in the presence of oxygen. Similarly, any metal can be employed which will form a conductive oxide when in contact with the potassium nitrate ($KNO_3$) layer in the presence of an applied electric field.

Once the bottom electrodes are configured, and optional, second, non-semiconductor dielectric is applied uniformly over the first or bottom electrode. The non-semiconductor dielectric, such as CVD glass or silicon nitride, is then etched at certain selective spots called vias which are the predetermined areas of contact between the bottom and top electrodes which sandwich the ferroelectric layer. The second non-semiconductor dielectric layer can be eliminated if the top and bottom electrodes are of chemically dissimilar material such that the step of configuring the top electrode will not adversely affect the bottom electrode.

At this point, the ferroelectric material is applied. This material is preferably Phase III potassium nitrate which is formed by evaporating, under vacuum, $KNO_3$ (preferably reagent or ultrapure grade), and collecting the vapors as a crystalline thin film. Although not always necessary, the vacuum can then be relieved and the crystallized product cooled to room temperature.

Occasional failures occur due primarily to cracks or imperfections in the $KNO_3$ layer. The electrode materials have a tendency to migrate into these cracks and short out the device which electrode materials on one side of the ferroelectric layer contact electrode materials on the opposite side of the ferroelectric layer. This problem occurs more frequently when the top electrode is deposited via sputtering as opposed to evaporation from a heated filament. This is most likely due to the high impact energy of the material when sputtered.

In order to substantially cure this problem, a non-conductive layer(s) is applied during the same pump down or vacuum step which is employed to form the potassium nitrate layer. Any suitable insulating material can be used such as $SiO_2$, SiO or $Si_3N_4$ for example. The insulating layer can be applied by means of evaporation or sputtering although the latter technique is is preferred. Furthermore, multiple layers of the non-conductive material can be employed to insure a thorough filling of any imperfection which may exist in the $KNO_3$ layer.

By employing any known photoresist techniques, vias are formed in the insulating layer(s) and the insulating material is sputter etched down to the surface of the $KNO_3$ layer. The photoresist can then be removed by, for example, sputtering which will result in a $KNO_3$ layer in which the cracks have been filled with an insulator. The top electrode can then be applied.

The top electrode is applied by uniformly depositing a conductive layer (a metal or doped polysilicon) and forming the top electrode by a technique which will be more fully explained later. Like the bottom electrode, the top electrode is fabricated from a conductive metal oxide or from a metal or metal alloy which will oxidize to form a conductive oxide. Conductive oxides are well known. Examples of such materials are indium-tin oxide ($In_2O_3SnO_2$), tin oxide ($SnO_2$) or palladium oxide (PdO).

Once the top electrode is formed, the entire surface of the device can be covered with a non-semiconductor dielectric such as CVD glass or silicon nitride to aid in protecting any exposed regions of the ferroelectric material. If the ferroelectric is Phase III potassium nitrate, great care must be taken to prevent moisture contact. If there is little chance of exposing the monolithic structure to an environment having relative high humidity, the top insulating passivation layer can be eliminated. If the passivation is, in fact, employed as a final step in the processing, this layer is etched from around the bonding and contacting pads and a conductor such as metal or doped polysilicon can be injected into these areas for connecting the top electrode through the connecting pads to predetermined spots on the semiconductor integrated circuit and for filling the bonding pads to provide external electrical contacts to other sources. As an alternative, a uniform metal layer can be applied directly over the top electrode and removed by standard photoresist techniques in unwanted areas by chemical or sputter etching for example. The top metal layer can then be used for connecting the memory array to an adjacent I.C. circuit.

Another aspect of the invention is now explained. If one attempts at this point to simply configure a top electrode, certain processing difficulties arise. It is desirable to contain all of the $KNO_3$ within the confines of the top electrode to protect the $KNO_3$ from contact with the environment which, particularly under high humidity conditions, can greatly and adversely affect the performance of the $KNO_3$. Fine line etching of the $KNO_3$ requires photoresist techniques which, in turn, requires etchants which are high in moisture content. Thus, special processing techniques have been developed in order to maintain the ferroelectric material below and confined by the top electrode material.

Once the $KNO_3$ layer is formed over the bottom electrode non-semiconductor dielectric layer, a uniform layer of protective metal is applied. The protective metal can be composed of the same materials which make up the top and bottom electrodes or can be a material such as that disclosed above. Once the ferroelectric material is uniformly coated with the protective metal, the protective metal-ferroelectric material can be etched by standard photoresist techniques resulting in a well defined pattern of ferroelectric material having a protective metal coating thereon. The photoresist can then be removed by well known techniques. Removal of the photoresist at this stage does not adversely affect the ferroelectric material because of the protective metal layer. The top electrode can then be applied by uniformly depositing a conductive layer (a metal or doped polysilicon) and configured to cover, in image-wise configuration, the ferroelectric material protective metal layer. These processing techniques will be gone into in greater detail in describing the figures appended to the present application.

Once the top electrode is formed, the entire surface of the device can be covered with a non-semiconductor dielectric such as CVD glass or silicon nitride to aid in protecting any exposed regions of the ferroelectric material. As stated previously, the ferroelectric material is extremely moisture sensitive although, at this stage, it has been protected by the used of the protective metal layer and the top electrode. Thus, the use of the top insulating passivation layer can be eliminated if desired. This is particularly true if there is little chance of exposing the monolithic structure to an environment having a relatively high humidity. If the passivation is, in fact, employed as a final step in the processing, this layer is etched from around the bonding and contacting pads and a conductor such as metal or doped polysilicon can be injected into these areas for contacting the top electrode through the connecting pads to predetermined spots on the semiconductor integrated circuit and for filling the bonding pads to provide external electrical contacts to other sources.

Turning now to the figures.

Figure 1:
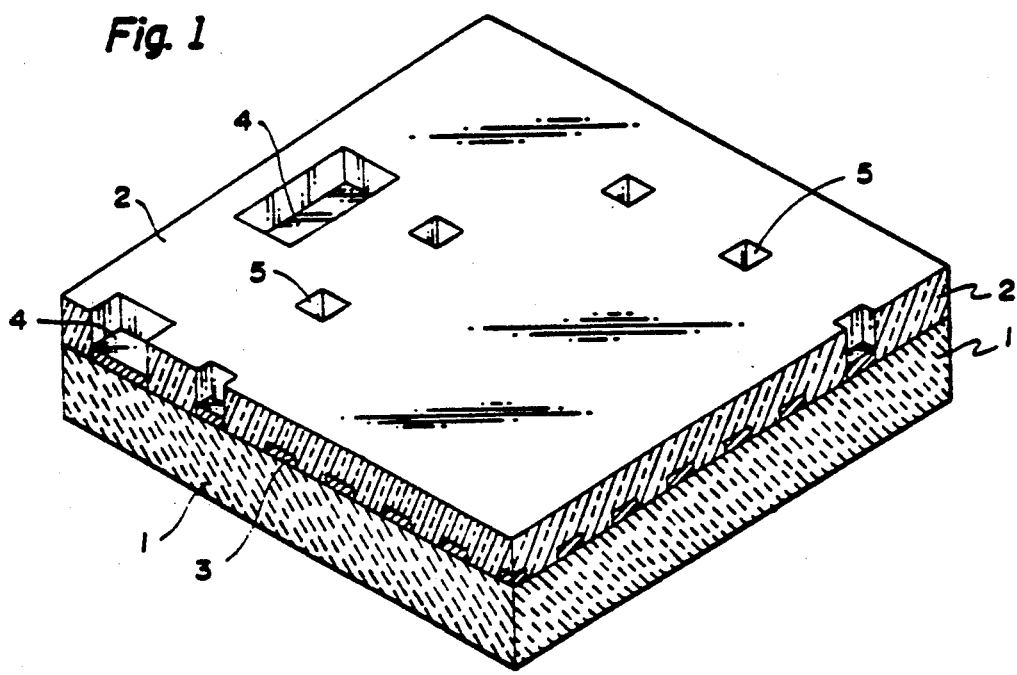
FIGS. 1 to 8 and 5A represent structures of the present invention in various stages of completion.

Turning to FIG. 1, a semiconductor integrated circuit is shown with interconnects 3 and non-semiconductor dielectric 2. The interconnects can comprise any acceptable conductive material such as doped polysilicon or a metal such as gold, silver or aluminum. The interconnects can be formed by standard photoresist techniques notoriously well-known in the art. If the interconnects are to be used as the bottom electrode, and thus come in contact with the ferroelectric layer, they should be fabricated from a conductive metal oxide or from a metal or metal alloy which will oxidize to form a conductive oxide as discussed previously. Upon the interconnects is placed a non-semiconductor dielectric 2 such as CVD glass or silicon nitride. The dielectric layer is intended to insulatively separate the interconnects from the bottom electrode of the ferroelectric device.

Once non-semiconductor dielectric layer 2 is uniformly applied to semiconductor integrated circuit 1 and interconnects 3 bonding pad holes 4 and contact pad holes 5 are formed. Again, these can be fabricated by employing standard photoresist techniques. The bonding pads 4 are intended to supply contact areas wherein the semiconductor integrated circuit could be functionally connected to external elements while the contact pads 5 are intended to provide functional connections between the ferroelectric device and the semiconductor integrated circuit.

Figure 2:
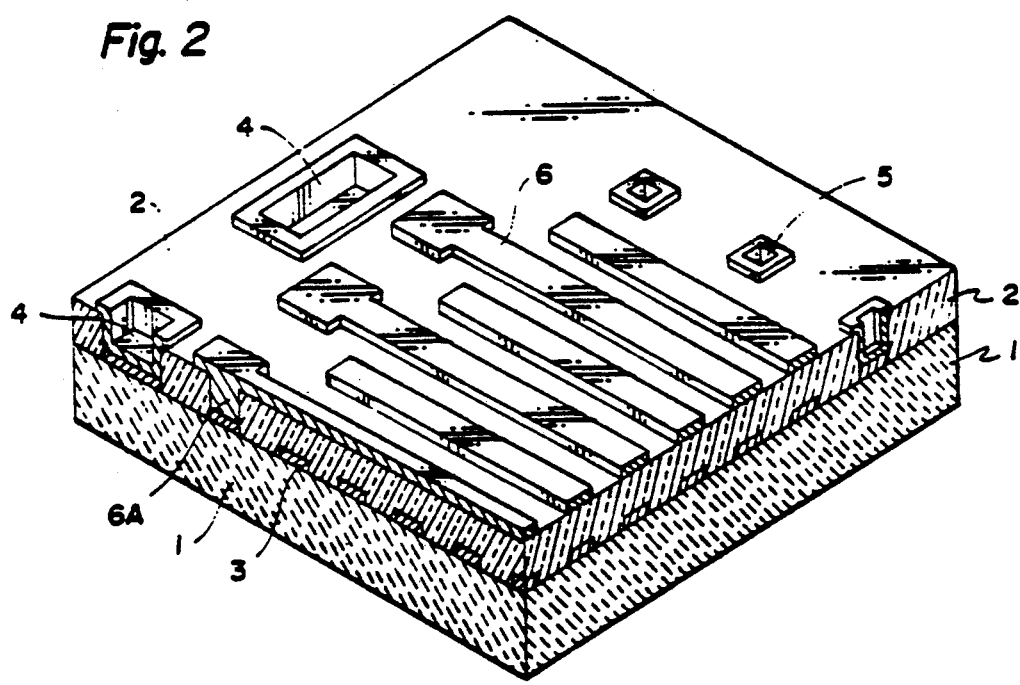

Referring to FIG. 2, after application of non-semiconductor dielectric layer 2, the bottom electrode 6 of the ferroelectric device can then be formed. As in the fabrication of interconnects 3, bottom electrode 6 can be formed by standard photoresist techniques. Again, the bottom electrode would be fabricated from a conductive metal oxide or from a metal or metal alloy which will oxidize to form a conductive oxide as discussed previously. This layer can, for example, be uniformly applied to non-semiconductor dielectric layer 2 by vacuum deposition whereupon a polymerizable plastic is applied which is polymerized in image-wise configuration and washed away in non-polymerized areas. The bottom electrode material layer is then etched away in non-protected areas forming electrodes 6. At the same time, contact pads 6A can be filled with conductive material in order to functionally connect bottom electrode 6 to semiconductor integrated circuit 1. As an alternative, electrodes 6 can be connected to the integrated circuit at 6A later with conductive material 13, 14 (See FIG. 8).

Figure 3:
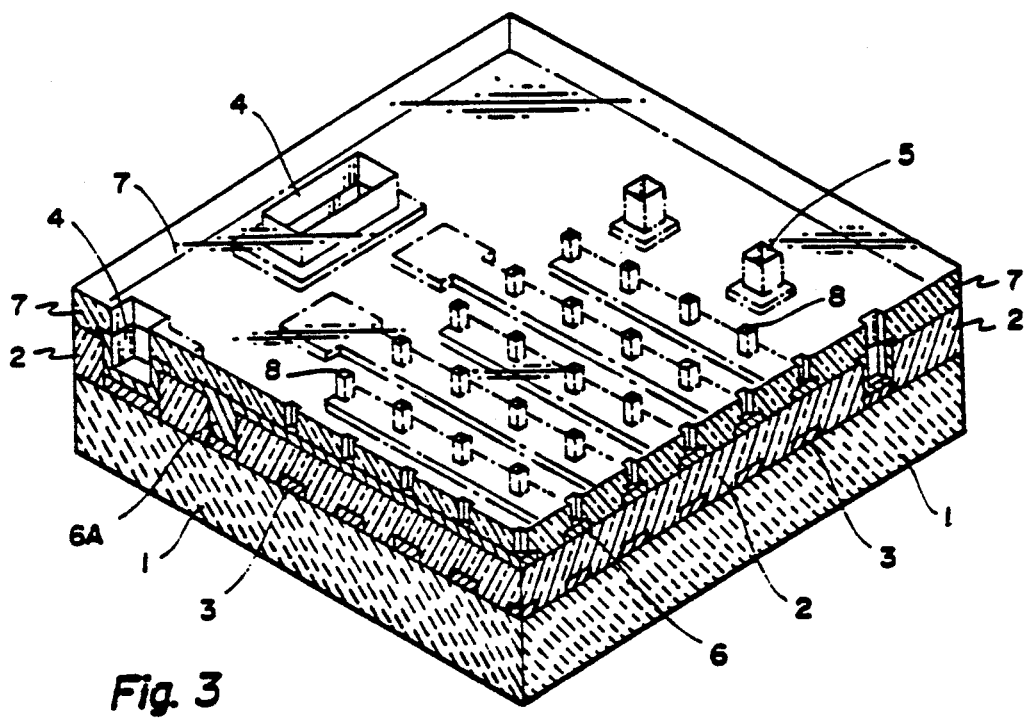

Turning now to FIG. 3, a second non-semiconductor dielectric layer 7 is optionally applied over bottom electrode 6-6A. Because functional contact must be maintained between bottom electrode 6 and the later applied top electrode 11 through ferroelectric layer 9, vias 8 are cut into non-semiconductor dielectric layer 7 at the intersect points between the bottom and top electrodes. Although the use of the second non-semiconductor dielectric is optional, it generally provides for less critical processing tolerances and usually proves beneficial to the electrical performances. As in the bottom non-semiconductor dielectric layer, the upper layer 7 can be comprised of CVD glass, silicon nitride or any other appropriate non-semiconductor dielectric material and the vias can be formed, again, by standard photoresist techniques.

At this point, the heart of the ferroelectric device is formed-ferroelectric layer 9. This material is vacuum deposited as a thin film over bottom electrode 6 and non-semiconductor dielectric 7 and is preferably composed of Phase III potassium nitrate which is stable at ordinary room temperature. The ferroelectric layer is intended to have a thickness less than 11 microns and is formed by vacuum deposition at a specific temperature range. Although not absolutely necessary, the dielectric can be cooled in a predetermined dry gas, such as nitrogen, without quenching. Care must be taken to prevent moisture from contacting the ferroelectric layer as moisture could destroy its ferroelectric properties.

Figure 4:
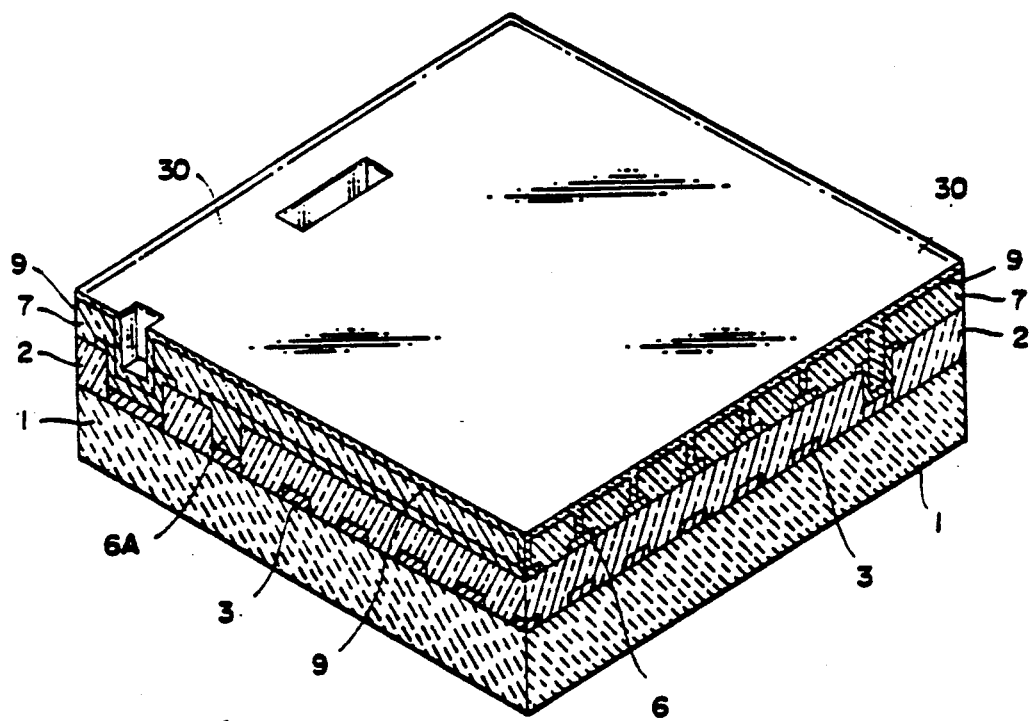

Various ferroelectric materials have been studied for their information storage capability. Although many materials exhibit the ferroelectric phenomenon, the predominent materials previously studied for memory application are barium titanate, potassium dihydrogen phosphate, tri-glycerin sulfate, and Phase III potassium nitrate. Phase III potassium nitrate exhibits a well-defined critical switching threshold and is therefore a preferred ferroelectric material. If potassium nitrate is chosen as the ferroelectric material, a preferred layer thickness is found to be from 100 Angstrom units to 1000 Angstrom units and, within that range, it has been found that optinum results are achieved when the thickness of Phase III potassium nitrate which is stable at standard temperature and pressure has a thickness of less than 1 micron. Referring to FIG. 4, the ferroelectric layer 9 is uniformly applied to non-semiconductor dielectric and fills the vias and thus contacts selected portions of bottom electrode 6. The "crack filling" insulating layer 30 (FIG. 4) is then applied. During the same pump down or vacuum step which is employed to form the potassium nitrate layer, any suitable insulating layer 30 can be applied by means of evaporation or sputtering although the latter technique is preferred. Examples of suitable insulating materials are $SiO_2$, $SiO$ or $Si_3N_4$. Furthermore, multiple layers of the non-conductive material can be employed to insure a thorough filling of any imperfection 32 (see FIG. 5A) which may exist in the $KNO_3$ layer. By employing any known photoresist techniques, vias are then formed in the insulating layer(s) and the insulating material is sputter etched down to the surface of $JNO_3$ layer 9. The photoresist can be then removed by, for example, sputtering which will result in a $KNO_3$ layer 9 in which the cracks have been filled with an insulator. The surface of layer 9 will be bare for contact with a conductive layer (not shown). See FIG. 5A which shows a magnified cross-sectional view of the crack filling function of insulator 30 at line 5A-5A of FIG. 5. On top of ferroelectric layer 9 is placed the conductive layer by any of the variously well-known standard techniques. As was stated with regard to the bottom electrode, the top electrode should be fabricated from a conductive metal oxide or from a metal or metal alloy which will oxidize to form a conductive oxide as discussed previously. This layer can be formed, for example, by vacuum deposition or sputtering.

Figure 5:
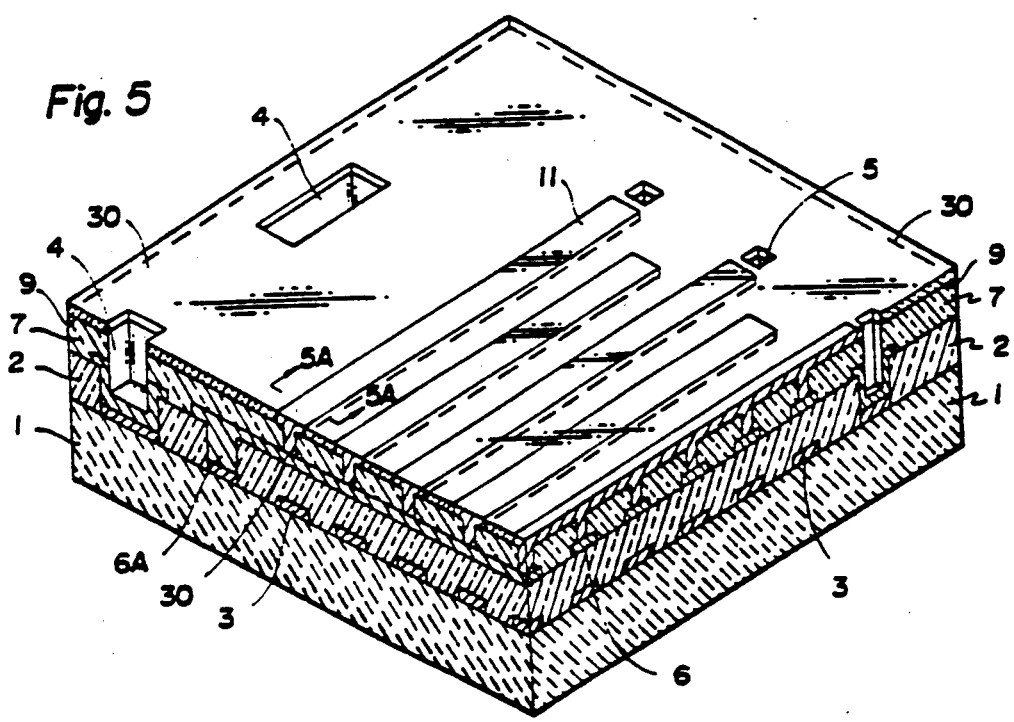
Figure 5A:

The top electrode 11 can then be configured into its final form as shown in FIG. 5. There are several important considerations which must be noted when forming electrodes 11. If standard photoresist techniques are employed, the aqueous solutions used to etch the conductive layer to form electrodes 11 may adversely affect ferroelectric layer 9 due to the water content of etching solutions. At this point, the critical area of the $KNO_3$ is located in the vias which would be somewhat isolated from etching solutions. If sufficient care is taken to prevent the acidic etching solutions from contacting the $KNO_3$ in the vias, it may be possible to use such solutions. More preferably, unwanted areas of conductive layer 10 can be removed by back sputtering the electrode in image-wise configuration. For example, a photoresist mask can be formed on conductive layer 10 to cover only conductive areas corresponding to final electrode configuration 11. The conductive layer can then be partially etched and then back sputtered to remove the remaining conductive material. If the photoresist mask is of proper thickness, no etching is needed and a back sputtering operation can be used to simultaneously remove unwanted conductive material and portions of the mask covering electrodes 11.

Figure 6:
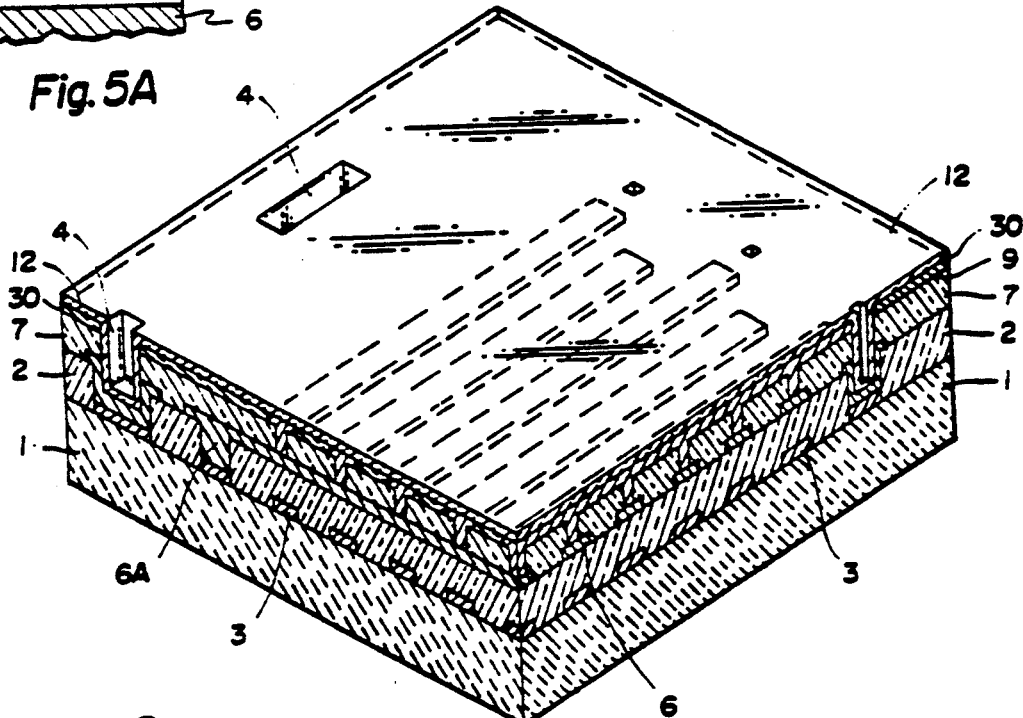

Once top electrode 11 is formed, the entire structure can be covered with a top passivation layer such as passivation glass or silicon nitride to prevent moisture contamination of the ferroelectric layer. If the ferroelectric material is Phase III potassium nitrate, extra care must be taken for this material reverts to another phase (Phase III) and (Phase II) loses its ferroelectric properties in the presence of moisture. If there is little danger of moisture contamination, the top passivation layer 12 shown in FIG. 6 can be eliminated.

Figure 7:
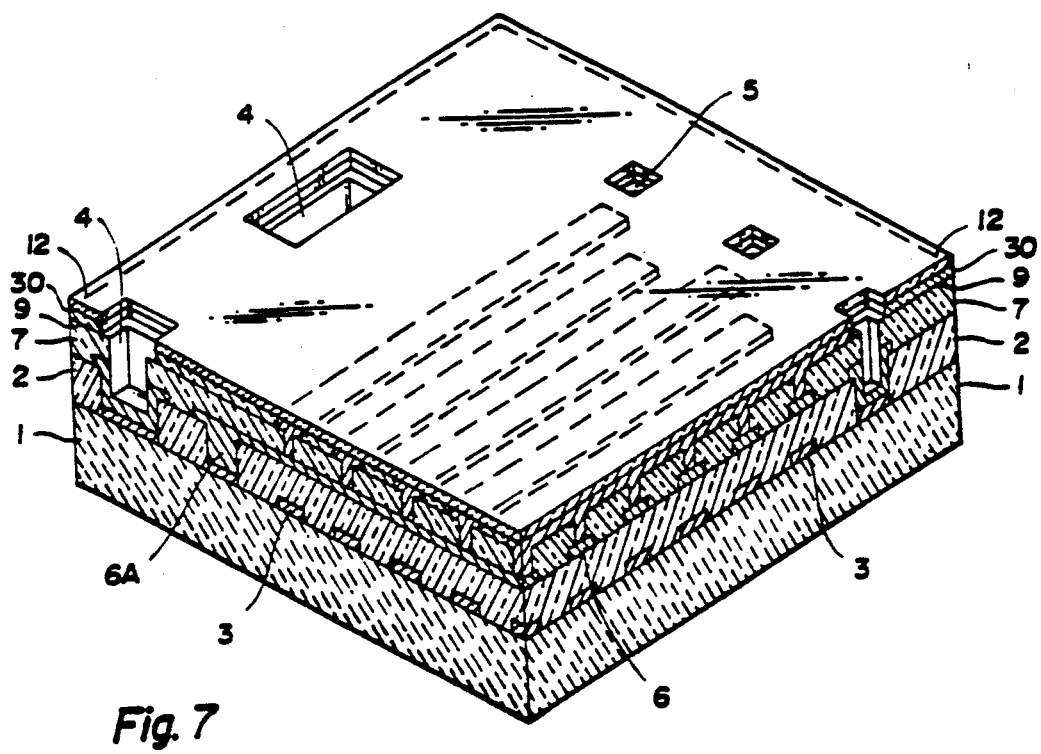
Figure 8:
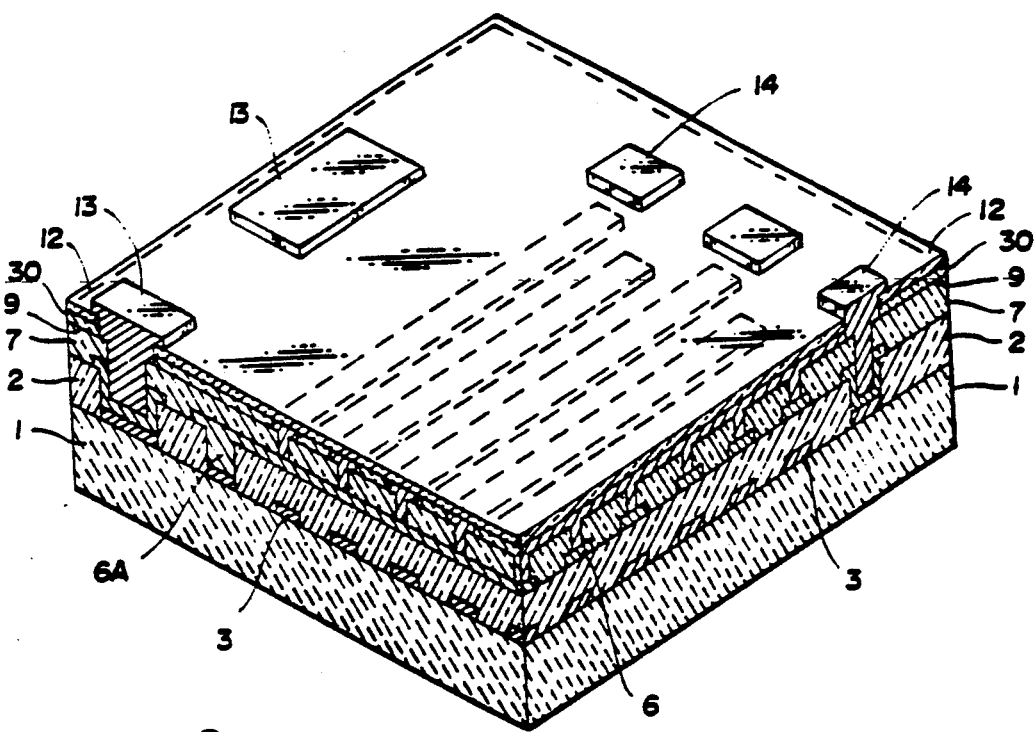

At this point, the passivation glass layer 12 is etched as shown in FIG. 7 using standard photoresist techniques. This is done to aid in filling the bonding and contact pads with conductive material to provide for electrical contact between the top electrode and the IC address circuitry and the semiconductor integrated chip with external access sources. Once this is accomplished, the bonding and contact pads are filled with conductive material 13, 14, respectively, as shown in FIG. 8. The filling of these areas can be done by depositing a uniform layer of conductive material and standard photoresist techniques used to remove it in all areas but in the contact and bonding pads.

The monolithic semiconductor integrated circuit-ferroelectric device is particularly adapted for use in binary systems, i.e., computers and the like, and processed therefor. It was discovered that the ferroelectric devices of the present invention produce an unexpected result in their failure to exhibit a "waiting" effect, a distinct advantage over prior art ferroelectric devices. This unobvious result achieved was attributable to the formation of a crystalline thin film of Phase III potassium nitrate, since similar devices prepared from "bulk" Phase III potassium nitrate exhibit a "waiting time" and are unstable under ambient conditions, i.e., room temperature and pressure over an extended period of time.

Figure 9:
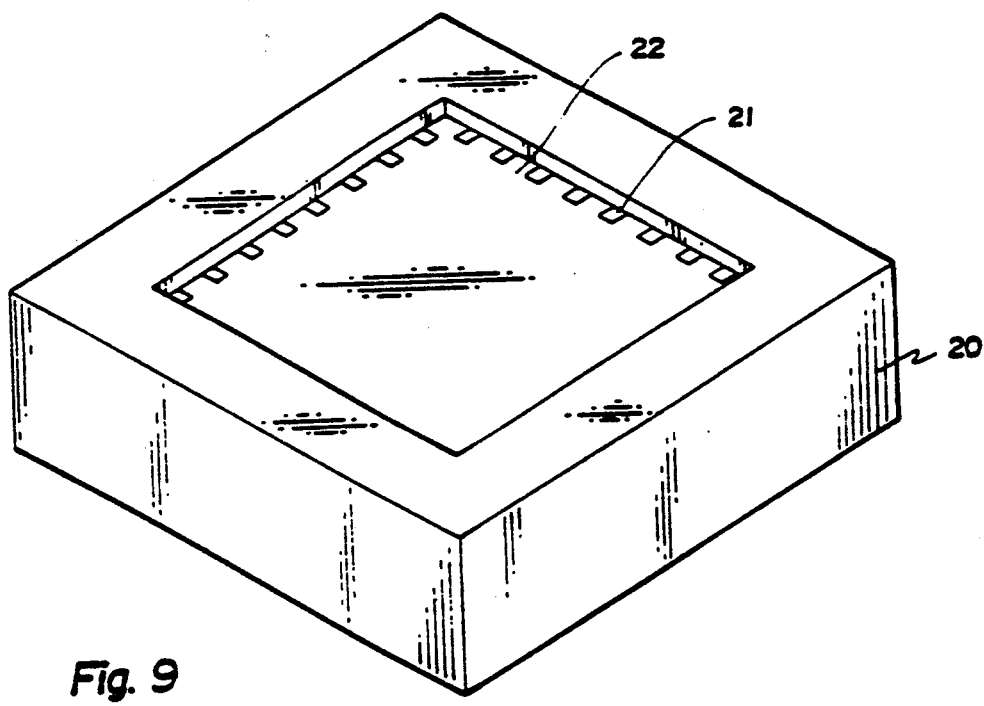
FIG. 9 shows a semiconductor integrated circuit chip for accepting a ferroelectric device within the logic circuitry rather than on top of it.

FIGS. 1-8 deal with the fabrication of a monolithic semiconductor integrated circuit-ferroelectric memory device wherein the memory device is stacked directly upon the semiconductor integrated circuit interconnects. Several ferroelectric memory devices may be "stacked" on an IC device and such a configuration is considered part of the present invention. FIG. 9 shows a semiconductor integrated circuit which has been adapted to accept a ferroelectric device where this device is within and surrounded by the interconnects of the semiconductor integrated circuit, rather than being located on top of these elements.

More specifically, the decode integrated circuit logic is contained in area 20 and the interconnects are polytabs or another electrically conductive material emanating from this logic circuit and extending to inner surface 22 at points 21. Surface 22 is flat and is usually composed of $SiO_2$. Fabrication of the ferroelectric device within areas 22 parallels the process steps outlined in FIGS. 1–8. The only difference is that the bottom and top electrodes of the ferroelectric device are connected to predetermined polytabs at the periphery of the ferroelectric device rather than to interconnects below the ferroelectric device of the previous embodiment. The only substantive difference in the process steps would be elimination of the need for insulating the bottom electrode from the interconnects, i.e., the elimination of layer 2 in FIG. 1. Other then that, the steps are identical.

Another embodiment of the invention is now described referring to FIGS. 1–3, 10–15 and 9, in the order these Figures are mentioned. For brevity, common description stated above will not be repeated.

Various ferroelectric materials have been studied for their information storage capability. Although many materials exhibit the ferroelectric phenomenon, the predominant materials previously studied from memory application are barium titanate, potassium dihydrogen phosphate, tri-glycerin sulfate, and Phase III potassium nitrate. Phase III potassium nitrate exhibits a well-defined critical switching threshold and is therefore a preferred ferroelectric material. If potassium nitrate is chosen as the ferroelectric material, a preferred layer thickness is found to be from 100 Angstrom units to 25,000 Angstrom units and, within that range, it has been found that optimum results are achieved when the thickness of Phase III potassium nitrate which is stable at standard temperature and pressure has a thickness of less than 2 microns.

Figure 10:
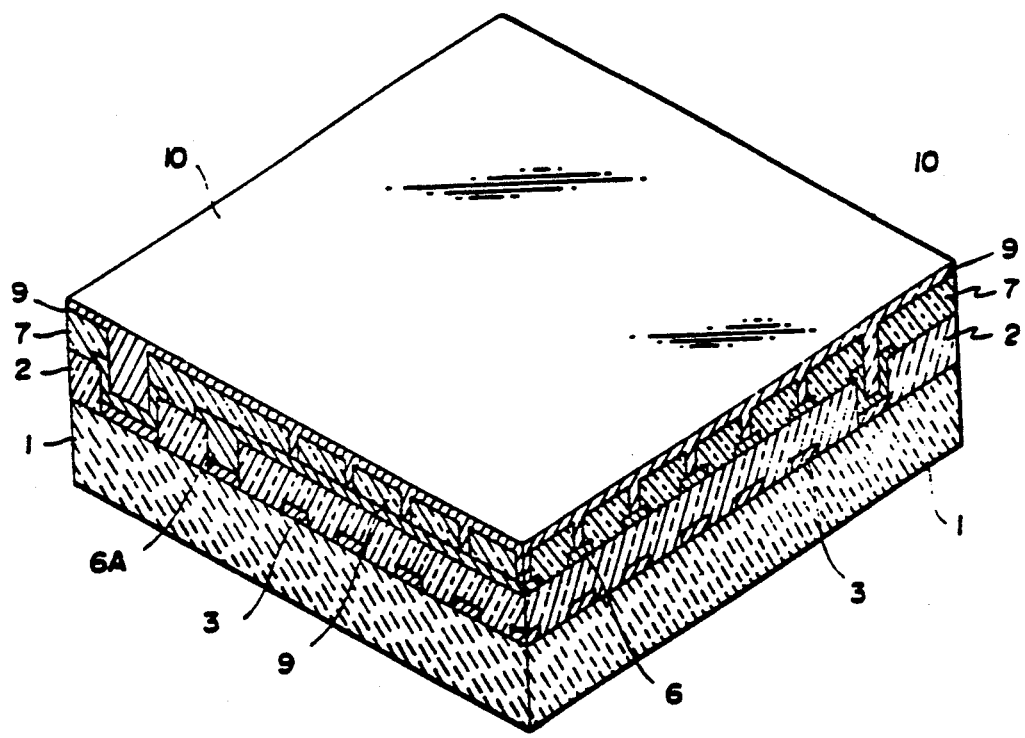
FIGS. 10 to 15 represent structures in various stages of completion according to another aspect of the invention.

Referring to FIG. 10, the ferroelectric layer 9 is uniformly applied to non-semiconductor dielectric layer 7. The ferroelectric material uniformly coats the non-semiconductor dielectric and fills the vias and thus contacts selected portions of bottom electrode 6. On top of ferroelectric layer 9 is placed protective conductive layer 10 by any of the variously well-known standard techniques. For example, protective metal layer 10 can comprise a metal such as gold, silver or aluminum or doped polysilicon and can be applied to ferroelectric layer 9 by vacuum deposition or sputtering. Also, materials as stated above can be employed which will improve the longevity of the memory device.

An object of the invention is to contain the ferroelectric layer completely below and protected by the top electrode. If the ferroelectric material is allowed to uniformly rest over the entire surface of the bottom electrode-non-semiconductor dielectric layers, moisture can contact the ferroelectric material which will virtually destroy its usefulness as a memory material.

The uniformly applied ferroelectric layer 9 is thus coated with protective metal layer 10. On top of metal layer 10 is coated a photoresist layer which is exposed in image-wise configuration to harden the photoresist in a pattern which will form the final desired pattern of the protective metal layer. The photoresist can then be washed away in non-hardened areas. This wash away step will not adversely affect the Phase III potassium nitrate layer due to the existence of protective metal layer 10. The hardened photoresist and unprotected metal layer 10 and ferroelectric layer 9 can then be removed by well-known techniques such as by sputter etching or ion milling.

Figure 11:
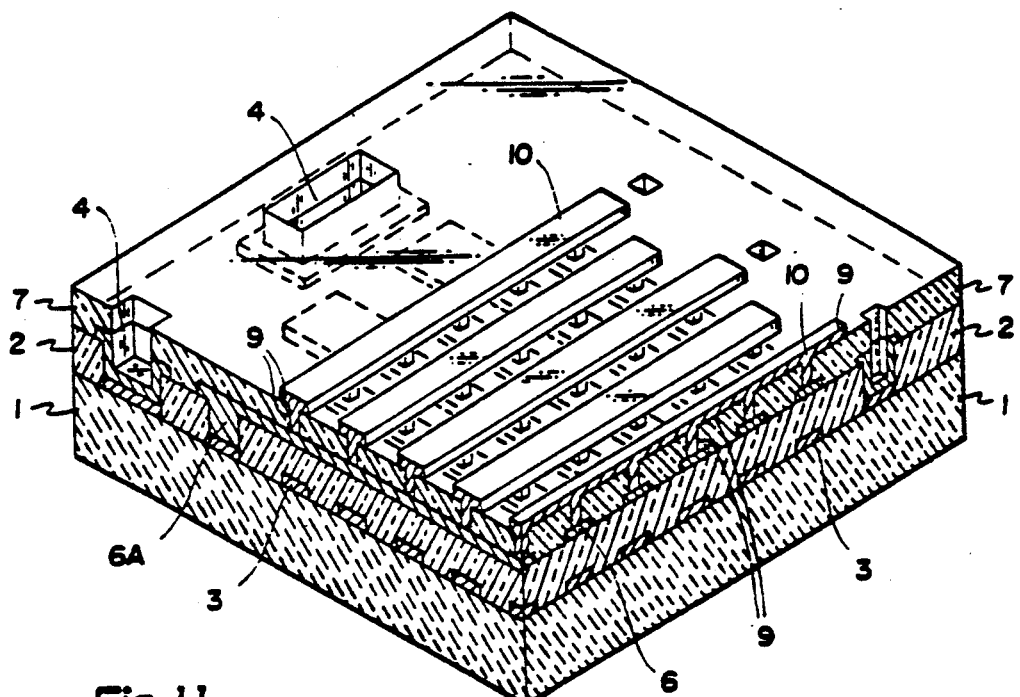

FIG. 11 shows a configuration wherein the ferroelectric layer 9 and protective metal layer 10 have been configured to substantially conform to the later applied top electrode. It is only necessary that the $KNO_3$ and protective metal layers remain at the intersect points between the top and bottom electrodes. Thus, the $KNO_3$ and protective metal layers can be etched away everywhere but at vias 8 (FIG. 3). The embodiment shown in FIG. 11 wherein the ferroelectric layers 9 and protective metal layer 10 are configured to substantially conform to the later applied top electrode is but one possible configuration of the invention.

Figure 12:
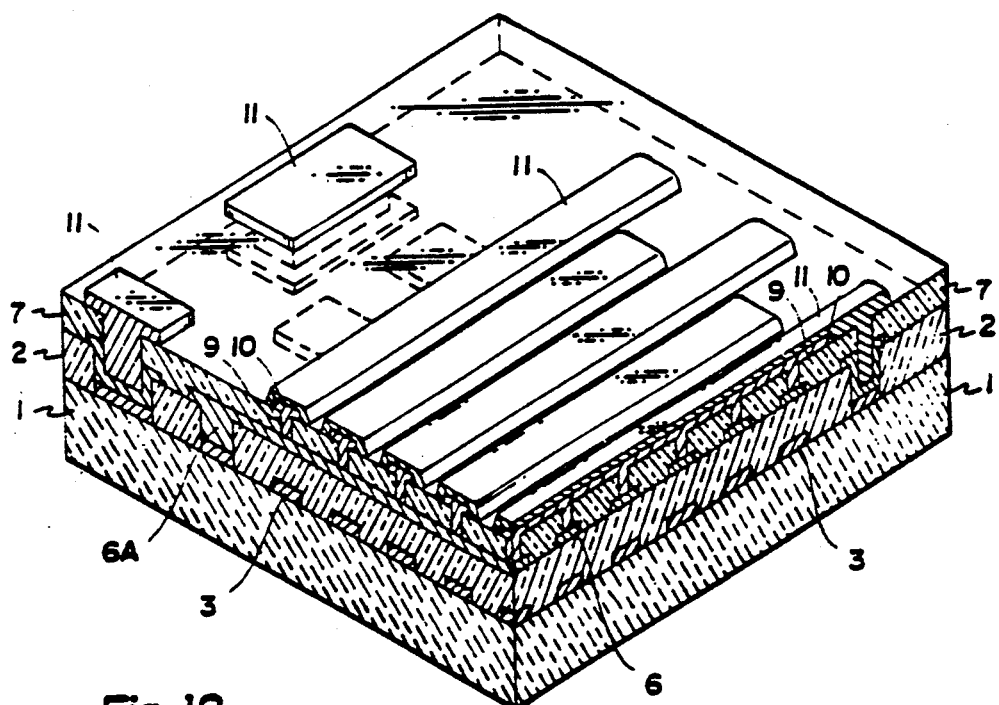

Referring to FIG. 12, top electrode 11 can be configured into its final form by first applying a uniform conductive layer and selectively etching away unwanted areas. This can be done in the same pump down operation that is used to sputter etch or ion mill the excess ferroelectric layer, protective metal layer and photoresist to produce the structure shown in FIG. 11. Standard photoresist techniques can be employed to form top electrode 11 only by practicing the present invention. Normally, if standard photoresist techniques are employed, the acid used to etch the top conductive layer to form electrodes 11 will undoubtedly adversely affect ferroelectric layer 9 due to the water content of etching solution. Regardless of the care taken in isolating the ferroelectric materials from the etching solutions, the ferroelectric layer will be at least partially destroyed by the moisture. By using protective metal layer 10, standard photoresist techniques could be used to form top electrode 11 including the use of acid based etching solutions, although protective metal layer 10 still performs a protective function if electrodes 11 are formed by ion milling or sputter etching; the later techniques result in higher manufacturing yields.

As seen by viewing FIG. 12, top electrode metal is used to fill vias 5 and bonding pad holes 4. It is necessary to provide contact between top electrodes 11 and the integrated circuit. This can conveniently be accomplished at this stage by merely extending electrodes 11 through vias 5.

Figure 13:
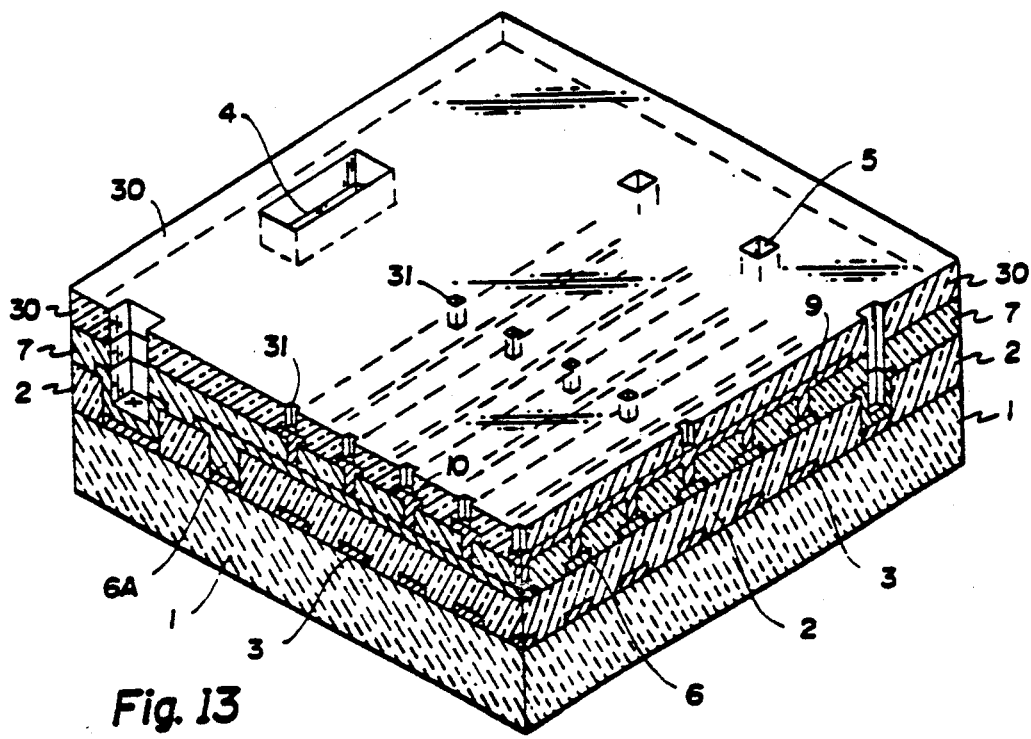

An alternative means of preparing the ferroelectric structure for application of top electrode 11 is shown in FIG. 13. In this embodiment, ferroelectric layer 9 and protective metal layer 10 are formed as described previously. Instead of immediately adding a top conductive layer to form electrodes 11, a non-conductive dielectric layer 30 is applied and vias 31 are cut therein which form the contact points between electrodes 11 and protective metal 10. The vias can be formed by standard photoresist technique. This alternative embodiment offers the advantage of further isolating ferroelectric layer 9 from the processing steps used in fabricating top electrode 11. If the ferroelectric-protective metal layers are configured to reside only at vias 8, it would be necessary to use vias 31 at each point that discontinuous layers 9 and 10 reside. In the configuration shown in FIGS. 13 and 14 wherein layers 9, 10 are continuous bars which parallel top electrode 11, only one row of vias 31 is needed to achieve electrical contact.

Figure 14:
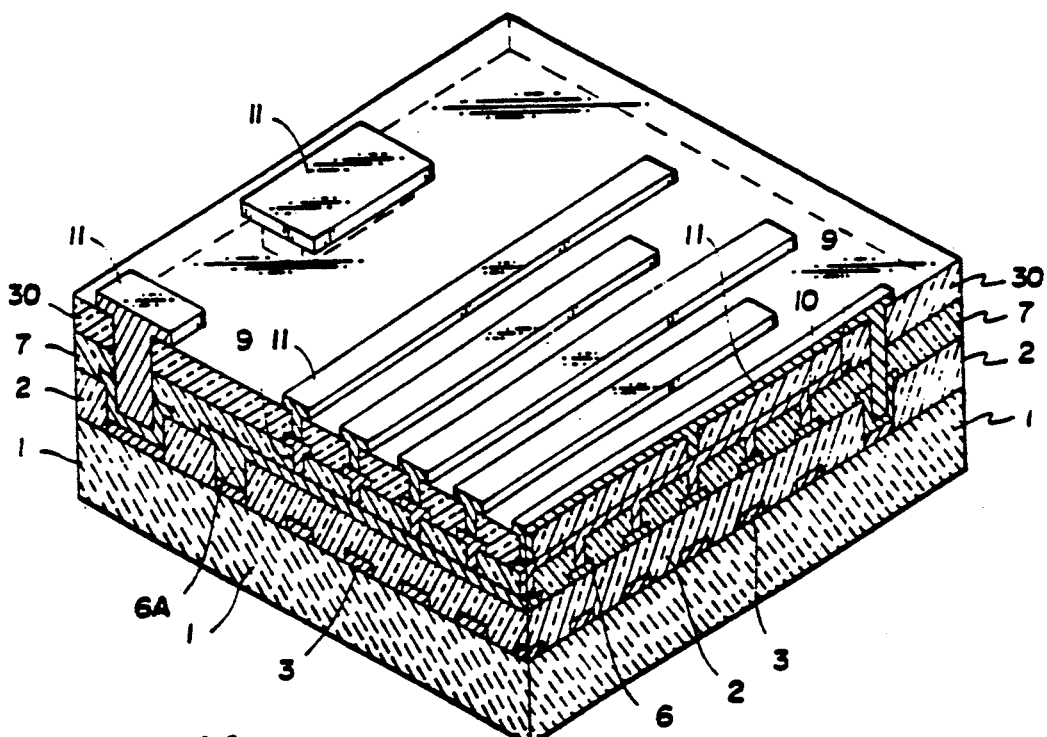

The structure of FIG. 14 is shown with top electrode 11 formed thereon. The top electrodes are formed in an identical manner as that described previously, i.e. by applying a uniform conductive layer, adding a photoresist, image-wise hardenings of photoresist, removing the unhardened photoresist and supporting metal via sputter etching, ion milling or acid etching in image-wise configuration and finally removing the hardened photoresist by any well-known technique.

Figure 15:
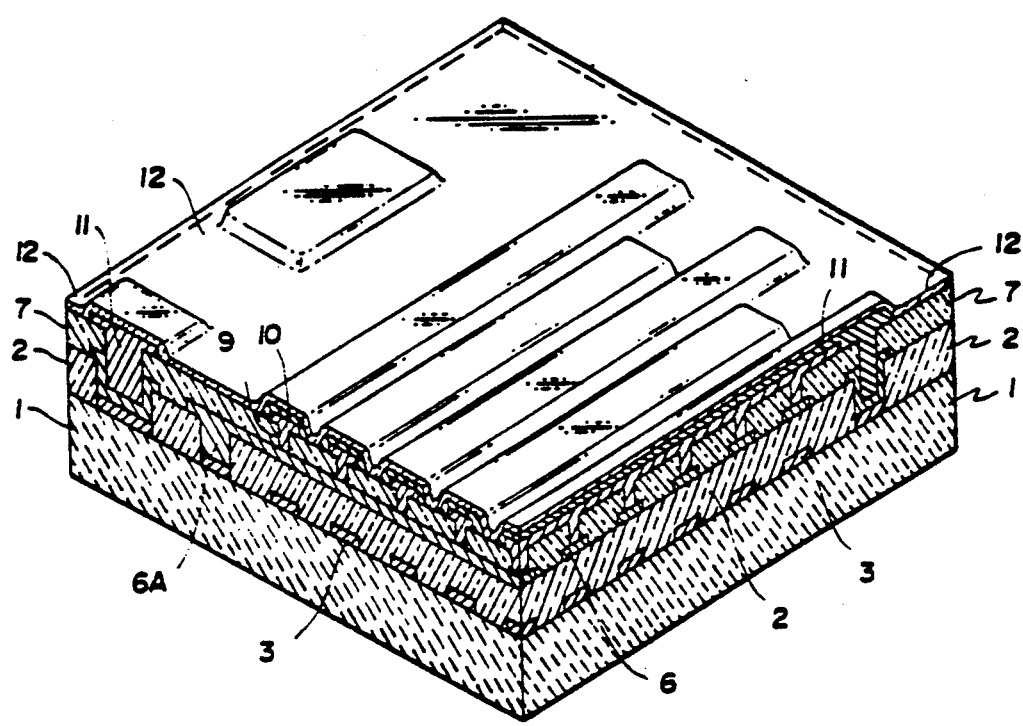

Once the top electrode layer is formed, the entire structure can be covered with a top passivation layer such as passivation glass or silicon nitride to prevent moisture contamination of the ferroelectric layer. The use of protective metal layer 10 and overlying top electrode 11 act as excellent protection for the ferroelectric material. However, if the structure is to be used in the presence of high humidity, passivation layer 12 adds further protection because if the ferroelectric layer is Phase III potassium nitrate, the material reverts to another phase and loses its ferroelectric properties in the presence of moisture. Top passivation layer 12 shown in FIG. 15 is optional and can be eliminated. The bonding pads 4 have previously been described as being filled with metal when the electrodes 11 were made. If, however, this were not done, it could be done at this time after first etching the passivation glass layer 12. If so, layer 12 need only be etched over metal 11 to provide for electrical contact between the semiconductor integrated chip and external access sources at this time.

The crux of this embodiment is the formation of a memory structure wherein the top electrode acts to overlap and protect the ferroelectric layer. Without using the protective metal layer of the present invention, the structure could only be fabricated by applying the top electrode layer over the ferroelectric layer and etching both layers simultaneously. This prevents the possibility of any overlap between the top electrode and ferroelectric layers which results in exposure of the ferroelectric material to moisture contamination. Photoresist cannot be directly applied to the preferred ferroelectric material, Phase III potassium nitrate. Thus, without using the protective metal layer, photoresist can only be added on top of electrode 11 resulting in the etching of electrode 11 and the Phase III potassium nitrate in one step. Referring to FIG. 12, the present invention provides for a top electrode 11 which not only resides on top of the Phase III potassium nitrate by also overlaps and covers the side walls of the ferroelectric material.

While the invention has been particularly shown and described with reference to preferred embodiments, it will be understood by those in the art the changes and modifications in form and details may be made without departing from the spirit and scope of the invention.

We claim:

1. A monolithic structure having a ferroelectric memory device electrically coupled by interconnects to an integrated circuit comprising:
   a substrate having an upper surface;
   a set of first parallel electrodes located upon or above said substrate upper surface;
   a set of second parallel electrodes located above but spaced from said first electrodes, both of the first and second electrodes being located above the upper surface of the substrate;
   the orientation of the second parallel electrodes being orthogonal to the orientation of the first parallel electrodes;
   a ferroelectric dielectric layer located above the upper surface of the substrate and between said set of first and second electrodes thereby to form a set of ferroelectric storage capacitors located wholly above the substrate; and
   conductive interconnects coupling said electrodes to said integrated circuit;
   said memory device coupled to said integrated circuit being a single monolithic structure.

2. The device of claim 1 wherein said integrated circuit includes a decode circuit for the array of ferroelectric capacitors.

3. The device of claim 1 wherein said first electrodes are located upon first level interconnects.

4. The device of claim 3 wherein said first electrodes are formed of a metal.

5. The device of claim 1 wherein said first electrodes are formed of a metal.

6. The device of claim 1 wherein said first electrodes comprise first level interconnects.

7. The device of claim 1 wherein said first electrodes comprise interconnect pads.

8. A monolithic structure having a ferroelectric memory device electrically coupled by interconnects to an integrated circuit comprising:
   a substrate having an upper surface;
   a set of first parallel electrodes comprising a first level composed of a metal located upon or above said substrate upper surface;
   a set of second parallel electrodes composed of a metal located above but spaced from said first electrodes by an insulating material, both of the first and second electrodes being located above the upper surface of the substrate;
   the orientation of the second parallel electrodes being orthogonal to the orientation of the first parallel electrodes;
   a ferroelectric dielectric layer located above the upper surface of the substrate and in vias formed in said insulating material between said set of first and second electrodes thereby to form a set of ferroelectric storage capacitors located wholly above the substrate in the regions defined by the intersection of the said set of first and second parallel electrodes;
   conductive interconnects coupling said electrodes to said integrated circuit;
   bonding pads acting as contact areas to functionally connect the integrated circuit to external elements; and
   said memory device coupled to said integrated circuit being a single monolithic structure.

* * * * *